United States Patent [19]

Barnes

[11] Patent Number: 4,504,821

[45] Date of Patent: Mar. 12, 1985

[54] INTEGRATED CIRCUIT BOARD SYSTEM AND AN INTEGRATED CIRCUIT BOARD ASSEMBLY FOR APPLICATION THERETO

[75] Inventor: Richard A. Barnes, Volusia, Fla.

[73] Assignee: General Electric Company, Syracuse, N.Y.

[21] Appl. No.: 339,745

[22] Filed: Jan. 15, 1982

[51] Int. Cl.³ .............................................. H05K 5/00
[52] U.S. Cl. ................................. 340/146.2; 361/412
[58] Field of Search ................. 340/146.2; 361/412, 361/413, 414, 415, 395, 399

[56] References Cited

U.S. PATENT DOCUMENTS

| | | | |
|---|---|---|---|
| 2,937,358 | 5/1960 | Bulger | 361/414 |
| 3,147,402 | 9/1964 | Hochstetler | 361/412 |
| 3,200,297 | 8/1965 | Gibson | 317/101 |
| 3,270,251 | 8/1966 | Evans | 361/412 |
| 3,466,564 | 9/1969 | Weischedel | 330/66 |
| 3,701,964 | 10/1972 | Cronin | 361/412 |
| 3,766,550 | 10/1973 | Vandemore et al. | 340/381 |
| 3,829,741 | 8/1974 | Athey | 317/101 |
| 3,898,370 | 8/1975 | Davy et al. | 361/414 |
| 4,059,849 | 11/1977 | Mitchell | 361/412 |
| 4,092,570 | 5/1978 | Nakamoto et al. | 318/102 |
| 4,157,534 | 6/1979 | Schachter | 340/147 |
| 4,250,563 | 2/1981 | Stuger | 364/900 |
| 4,288,841 | 9/1981 | Gogal | 361/414 |

OTHER PUBLICATIONS

Rasile et al., "Low-Cost Stacked Module", *IBM Tech. Disclosure Bulletin*, vol. 22, No. 2, Jul. 1979, pp. 525-526.

*Primary Examiner*—David H. Malzahn
*Attorney, Agent, or Firm*—Carl W. Baker; Richard V. Lang

[57] ABSTRACT

A passive programmed array is provided for each printed circuit board of a control system. The passive programmed array provides the logic connectors for the circuit elements mounted upon the printed circuit board, and includes an electronic key to ensure that output from a particular printed circuit board will be enabled only when the appropriate passive programmed array is connected.

7 Claims, 3 Drawing Figures

INTEGRATED CIRCUIT BOARD SYSTEM AND AN INTEGRATED CIRCUIT BOARD ASSEMBLY FOR APPLICATION THERETO

BACKGROUND OF THE INVENTION

This invention relates to integrated circuit boards, and, more particularly, to an integrated circuit board system which allows altering the position of a particular board without changing boards or rewiring a particular board.

In integrated circuit board systems a plurality of boards are inserted into plug-in connectors, which provide electrical power and logic connections with a system to be controlled and with other logic boards. To achieve high systems availability each board must be spared, i.e., a second board identical to each board in operation must be kept readily available for replacement should any particular board fail. This sparing requirement adds substantially to system cost, since a separate set of boards must be purchased and stored in a catalog storage, so that upon failure of any operating board a substitute board may be readily inserted into the system, so that the entire system does not have to be shut down while a duplicate board is manufactured or obtained from a vendor.

A system in which some functions are contained upon a mother printed circuit board and other functions are contained upon a daughter printed circuit board is described in U.S. Pat. No. 3,829,741, issued Aug. 13, 1974 to Athey. In the Athey patent a mother board includes a connector into which a daughter board having circuit elements thereon is inserted. Each daughter board is provided with a distinct connection mechanism, and each daughter board is a custom configuration with circuit elements thereon to provide complete functions to the mother board. Each daughter board has its unique engineering, manufacturing and servicing requirements determined by the circuit elements and functions included thereon.

SUMMARY OF THE INVENTION

Accordingly, an object of the present invention is to provide a wide variety of system control functions with a limited number of unique circuit board designs. A more specific object of the present invention is to provide a limited number of printed circuit control boards for insertion into a system backplane and a variety of interconnection boards, which when attached to the circuit control boards provide a particular predetermined function. A further object is to provide a keying arrangement which provides activation of a circuit board output, only if the appropriate interconnection board has been connected to the printed circuit control board.

The integrated circuit board arrangement of the present invention includes a printed circuit control board having a plurality of circuit elements disposed thereon with a plurality of interconnection pins projecting from its surface. The function of the printed circuit control board is determined by the interconnection pattern disposed upon an interconnection circuit board having connectors for attachment to the pins projecting from the printed circuit control board, so that when the two boards are interconnected, a predetermined function is provided by the combination of circuit boards. The interconnection board has a connector for receiving contacts disposed upon the control board. In a particularly preferred embodiment of the present invention an electronic key is disposed upon the interconnection board to enable the circuit outputs disposed upon the control board/interconnection board combination whenever an appropriate interconnection has been made, but disabling the outputs of the combination when the wrong board has been connected to the printed circuit control board.

BRIEF DESCRIPTION OF THE DRAWINGS

Features of the invention believed to be novel and unobvious over the prior art are set forth with particularity in the appended claims. The invention itself, however, as to organization, method of operation and best mode contemplated, together with further objects and advantages may best be understood by reference to the following description taken in conjunction with the accompanying drawings, in which like reference characters referred to like elements throughout, and in which:

DESCRIPTION OF THE PREFERRED EMBODIMENTS

Figure 1:
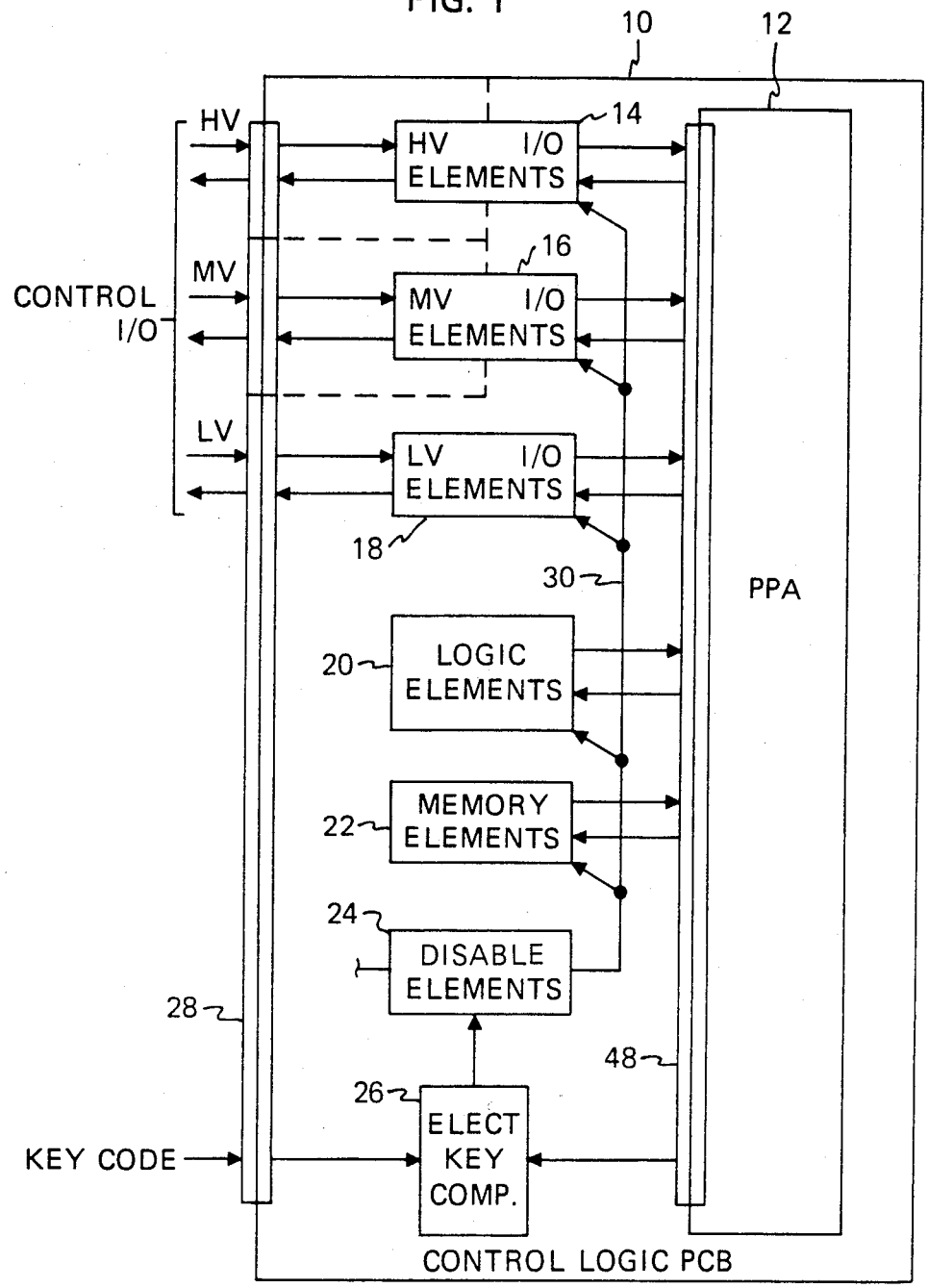
FIG. 1 is a schematic block diagram illustrating the elements of the present invention.

The present invention is illustrated schematically in FIG. 1. A printed circuit board 10, hereinafter termed the mother board, has a passive programmed array 12, hereinafter termed the daughter board, connected thereto. Mounted on the mother board 10 are high voltage input and output elements 14, middle voltage input and output elements 16 and low voltage input and output elements 18, along with logic elements 20, memory elements 22 and disable elements 24. An electronic key comparator 26, to be described in detail hereinafter, is also disposed on mother board 10. A plurality of contacts 28 are disposed on one edge of mother board 10 and provide connection for high voltage, middle voltage and low voltage elements to a backplane into which the mother board is connected as one of a plurality of boards mounted in a large system. The contacts 28 also serve to connect a test circuit which examines all elements via the connection shown schematically at 30, when a test pulse is applied to the circuit.

Figure 2:
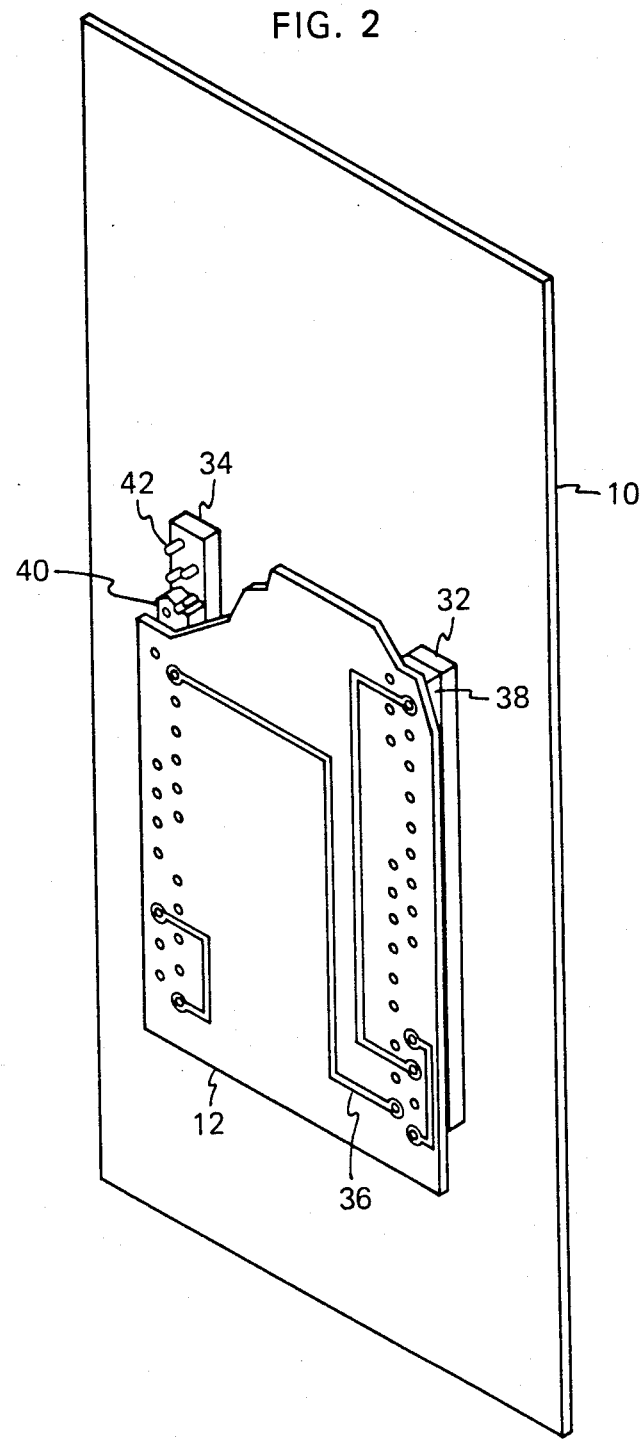
FIG. 2 is a schematic pictorial view illustrating the interconnection of the two boards according to the present invention.

The mother board 10 is configured for each unique functional application by means of a plug-in programming board, the daughter board 12, as shown in FIG. 2. Daughter board 12 is connected to the mother board 10 by connectors 32 and 34. Each connector consists of a plurality of pins 42 mounted on the mother board 10 and each connected to one or more of the circuit elements mounted on the mother board. The programming board provides physical interconnection via connectors 38, 40 to the input/output, logic and memory elements of the mother board 10. Interconnections 36 deposited upon the programming board 12 provide circuit interconnections between circuit elements disposed upon mother board 10 and may be fabricated in many patterns. By changing the connection pattern on the programming daughter board 12, the overall function of the two board system can be determined. A large number, i.e., hundreds, of independent functions may be programmed by changing the interconnection of the functional elements upon the mother board by connecting a daughter board having the necessary interconnection pattern printed thereon. The contacts 28 include connections for multiple voltage level connection from the printed circuit board 10 to a backplane as described in U.S. patent application Ser. No. 378,882, filed May 17, 1982, now U.S. Pat. No. 4,454,552 by R. A. Barnes and G. J. Bartz, and assigned to the present assignee. The high voltage input and output elements shown in block diagram form at 14 in FIG. 1 include the necessary elements to translate high voltage signals, e.g. 120 volt signals, to logic voltage level, e.g. 12 volts, and also provide buffering for the external drive circuits and electrical isolation and fault and ground current protection, so that the daughter board need only be able to handle logic level voltages. Similarly, the middle voltage input and output elements provide the necessary interfacing for the daughter board.

By using the passive programming board 12 with the control logic board 10 in combination as shown in FIG. 2, the number of connecting pins on the backplane required to implement a particular function is reduced, since it is not required that individual signals be transmitted to the backplane for connection to other elements upon the mother board. By using the programming board concept multiple voltage levels can be applied to a single control logic board, and the necessary isolation can be provided on the system backplane as described in the application Ser. No. 378,882 cited above. This substantially simplifies the manufacturing and wiring of the system as compared to the prior art technique of using a separate board for each voltage level and interconnecting low voltage elements via the backplane and those elements necessary to perform a particular function at other voltage levels at the board's front plane by point-to-point wiring.

The control logic printed circuit mother board 10 and passive programmed array daughter board 12 are both full edge boards as shown. However, each could be of wire wrapped construction if required for a particular installation. In a particular construction of the present invention the passive programmed array board 12 had two connectors with 78 pins each, although the number of connectors and pins is not important. The passive programmed array board can be made to plug onto either face of the printed circuit mother board. In the embodiment shown the passive programmed array board 12 carries only low voltage signals, but the passive programmed array board 12 could be configured to carry other voltage levels.

By using the two board arrangement described herein a small set, e.g., four, of control logic printed circuit mother board types can be used to implement a large number of diverse control functions by employing a larger number of passive programmed array boards, e.g., hundreds. This results in significant savings in engineering development costs, since the function of a mother board can be changed by designing the passive array board which includes only connection wires and no circuit elements. Using four types of control logic printed circuit mother board and about 150 passive programmed array board types, we were able to efficiently implement over 1000 board control functions. Functional changes in the logic connection can be readily and inexpensively made compared to making changes by designing a single full edge printed circuit board for each functional type. No change to the control logic printed circuit mother board is required in order to change the functional implementation, since the function can be completely dictated by the interconnection pattern on the passive programmed array. Therefore, the engineering cost is limited to that necessary to design each daughter board type to contain the passive programmed array for a specific function or subset of the total number of functions. A single passive programmed array can be used to provide the interconnection pattern for more than one function via selective utilization of the control I/O, and by employing the same interconnection pattern to connect distinct sets of circuit elements on separate mother boards to produce distinct functions.

Figure 3:
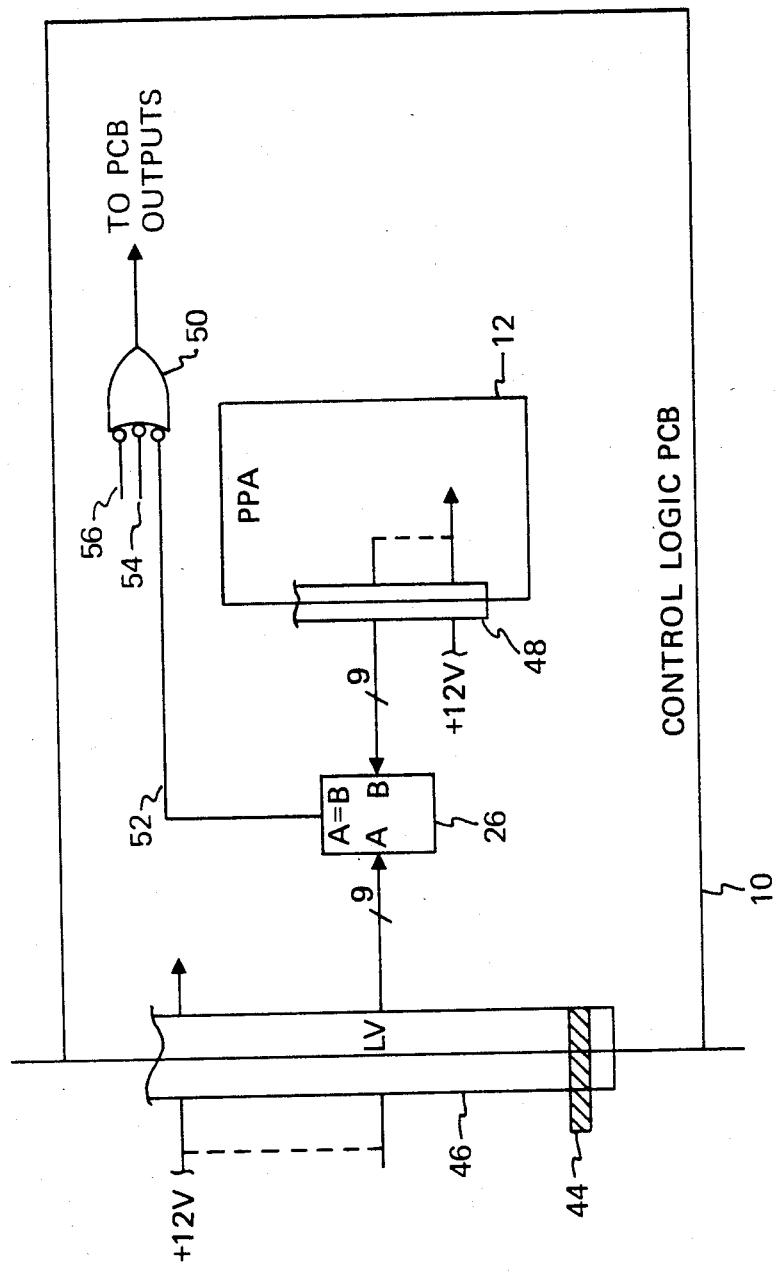
FIG. 3 is a block diagram showing the electronic key of the present invention.

Each passive programmed array is mechanically polarized so that it cannot be inserted upside down or in reversed side-to-side position. Each passive programmed array is given the same mechanical keying which prevents only the mechanical connection in upside down or side-to-side reversed position. Using a passive programmed array allows the use of an electronic keying arrangement, so that if an improper passive programmed array, daughter board, is connected for a specific location of a multiboard assembly, the outputs from the two board combination will be disabled. As shown schematically in FIG. 3 a mechanical key 44 is located on each mother board 10, so that with a plurality of such boards only one of the type required can be mechanically inserted into the backplane at each location. A plurality of mechanical keys having a unique arrangement for each type of mother board employed may be used, and the key 44 is shown as an illustration only. In order to control the functional operation of the mother/daughter board assembly connected to each backplane connector, a unique electronic key is coded into each passive programmed array board 12. The same unique electronic key is coded onto the proper printed circuit board slot backplane, so that upon connection with the backplane a signal is transmitted to a key comparator 26 located on the mother board 10. If the two identification codes are identical, the outputs for the high, medium and low voltage elements 14, 16 and 18, shown by the respective output arrows of the "control I/O" in block diagram form on FIG. 1, are enabled. If the identification codes are not identical, a signal is transmitted via line 52 to gate 50 and the PCB outputs are disabled. Gate 50 may also be controlled by signals from other inputs 56, 54 from other control circuits, not shown. In a system employing a 9 bit identification code, a maximum of 512 unique passive programmed array electronic keys are available. This number can be increased or decreased by using a larger or smaller code identification as required by a particular system.

The comparator on the control logic mother board 10 is used to determine if the correct passive programmed array board 12 is installed. Assuming the mechanical keys are properly positioned and the electronic key codes match, the printed circuit board outputs are allowed to be enabled and the system can function. Whenever the wrong passive programmed array is installed onto the printed circuit board at a particular location, the printed circuit outputs will be held in a high impedance state, thus maintaining the equipment controlled by the two board combination unaffected by the misinsertion. Using an electronic key arrangement allows the control logic printed circuit board to be designed, so that it is transparent to the end functional implementation; i.e., the passive programmed array sockets do not require mechanical keying for each separate passive programmed array. Each passive programmed array is mechanically compatible with the printed circuit board. However, only the passive programmed array matched directly with the slot into which the mother board is inserted will enable the outputs from the control logic printed circuit board. This ensures that misinsertion of circuit boards or passive programmed arrays cannot damage the printed circuit mother board or the passive programmed array board or any of the system equipment connected to it.

Using the arrangement of the present invention will allow a system to be maintained with a much lower requirement for spares of each type of printed circuit board. If four types of printed circuit mother board are employed for a particular system assembly, a much smaller number of complex, expensive control board spares would be required to maintain a particular level of availability, than if an entire spare set of control boards were required for each functional circuit board. This is due to the fact that if each function is performed by a unique control board, a sparing requirement, determined by the mean time between failure, would be established for each board; while a sparing requirement for each type of board would establish a rate for failure of a type, and since the failure rate covers a number of boards of each type, less than a full set of spares is required. In a particular example, a one-year inventory of a set of board types of the present invention can provide a system availability equal to a ten-year inventory of spares of unique circuit boards. Further, by using the passive programmed array of the type described herein, spares of the passive programmed arrays can be stored, rather than an equivalent number of complete printed circuit boards, thereby saving storage space, avoiding risk of damage to circuit elements stored in inventory, and significantly reducing cost.

As will be appreciated by those skilled in the art this invention may be modified to accommodate any particular integrated circuit board system. By placing the functional connections on a board separate from the printed circuit board to which the functional elements are attached, a single readily manufactured and reproducible printed circuit board configuration can be employed for a wide variety of functional requirements. Further, the design of each passive programmed array will be facilitated by a standardization of the element configuration upon each standard type of printed circuit board. Therefore, the present invention provides for an inexpensive and reliable system for a large number of circuits without uniquely designing, storing and maintaining a separate board for each such circuit.

What is claimed as new and desired to be secured by Letters Patent of the United States is:

1. In a system requiring multiple integrated circuit boards and having a panel providing a plurality of multiple contact connectors at a plurality of locations, each location requiring a unique combination of functions from the integrated circuit board cnnected thereto, an integrated circuit board assembly for use therewith comprising:
   A. a first integrated circuit board comprising
      1. a first multiple contact connector engageable with said multiple contact connectors at any one of a plurality of locations on said panel,
      2. a plurality of active integrated circuit elements disposed thereon having available all functional requirements of plurality of said panel locations; the functional requirement of a specific location being met by selective use of certain of said active circuit elements, and
      3. a second multiple connector disposed thereon connected to all of said integrated circuit elements, and
   B. a second passive circuit board designed for use in a specific panel location, having
      1. a third multiple contact connector for connection to said second multiple contact connector on said first board, and
      2. a connection pattern disposed thereon, said connection pattern selectively connecting certain of said active circuit elements in accordance with the requirements of a specific panel location.

2. The control board assembly of claim 1 wherein,
   A. said first multiple contact connector of said first circuit board is disposed on an edge thereof, and wherein,
   B. said second multiple contact connector of said first circuit board is disposed on a major surface thereof.

3. The control board assembly of claim 2 wherein,
   A. said second circuit board provides two opposed major faces, and wherein,
   B. said connector pattern is disposed on both surfaces thereof for interconnection flexibility.

4. In a system requiring multiple integrated circuit boards, the combination comprising
   A. a panel providing a plurality of multiple contact connectors at a plurality of locations, each location requiring a unique combination of functions from the integrated circuit board connected thereto, and providing at least one coarse mechanical keyway, each coarse keyway identifying collectively larger pluralities of locations, and a fine coded, first electronic key for identifying specific locations in said larger pluralities,
   B. a first integrated circuit board comprising
      1. a first multiple contact connector engageable with said multiple contact connectors at any one of a plurality of locations on said panel,
      2. a plurality of active integrated circuit elements disposed thereon having available all functional requirements of a plurality of said panel locations; the functional requirement of a specific location being met by selective use of certain of said active circuit elements,
      3. a second multiple contact connector disposed thereon connected to all of said integrated circuit elements,
      4. a mechanical key for mating with a keyway for which said first circuit board is functionally appropriate,
      5. an electronic key operable through said third connector, identifying said second board for a specific location, and
      6. an electronic key comparater connected to said first multiple contact connector for receiving a first electronic key coded for a specific panel location and for receiving a second coded electronic key from said second board,
   C. a second passive circuit board designed for use in a specific panel location, having
      1. a third multiple contact connector for connection to said second multiple contact connector on said first board, and 2. a connection pattern disposed thereon, said connection pattern selectively connecting certain of said active circuit elements in accordance with the requirements of a specific panel location, and
3. a coded second electronic key for identifying said second circuit board for its intended specific panel location, said comparator on said first board providing an activation signal indicative of identity of said first coded electronic key with said second coded electronic key.

5. The combination set forth in claim 4 wherein said first board further includes;

output enabling means for receiving said activation signal and for enabling outputs from said integrated circuit elements whenever said activation signal is received from said comparator.

6. In a system requiring multiple integrated circuit boards, the combination comprising
A. a panel providing a plurality of multiple contact connectors at a plurality of locations, each location requiring a unique combination of functions from the integrated circuit board connected thereto, and a coded, electronic key for identifying specific locations in said plurality,
B. a first integrated circuit board comprising
1. a first multiple contact connector engageable with said multiple contact connectors at any one of a plurality of locations on said panel,
2. a plurality of active integrated circuit elements disposed thereon having available all functional requirements of a plurality of said panel locations; the functional requirement of a specific location being met by selective use of certain of said active, circuit elements, and
3. a second multiple contact connector disposed thereon connected to all of said integrated circuit elements,
4. an electronic key operable through said third connector, identifying said second board for a specific location, and
5. an electronic key comparator connected to said first multiple contact connector for receiving a first electronic key coded for a specific panel location and for receiving a second coded electronic key from said second board,
C. a second passive circuit board designed for use in a specific panel location, having
1. a third multiple contact connector for connection to said second multiple contact connector on said first board, and
2. a connection pattern disposed thereon, said connection pattern selectively connecting certain of said active circuit elements in accordance with the requirements of a specific panel location, and
3. a coded second electronic key for identifying said second circuit board for its intended specific panel location, said comparator on said first board providing an activation signal indicative of identity of said first coded electronic key with said second coded electronic key.

7. The combination set forth in claim 6 wherein said first board further includes;

output enabling means for receiving said activation signal and for enabling outputs form said integrated circuit elements whenever said activation signal is received from said comparator.

* * * * *